(12) United States Patent
Lee et al.

(10) Patent No.: US 7,574,636 B2
(45) Date of Patent: Aug. 11, 2009

(54) SEMICONDUCTOR MEMORY DEVICE

(75) Inventors: Hi-Choon Lee, Yongi-si (KR);
Sung-Bum Cho, Yongi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 445 days.

(21) Appl. No.: 11/561,023

(22) Filed: Nov. 17, 2006

(65) Prior Publication Data
US 2008/0046788 A1 Feb. 21, 2008

(30) Foreign Application Priority Data
Dec. 26, 2005 (KR) .................. 10-2005-0129929

(51) Int. Cl.
*G11C 29/00* (2006.01)
(52) U.S. Cl. ..................... 714/719; 714/720
(58) Field of Classification Search ............. 365/201, 365/230.05; 714/773, 718, 719, 720
See application file for complete search history.

(56) References Cited

U.S. PATENT DOCUMENTS

| | | | | |
|---|---|---|---|---|
| 5,075,892 | A | * | 12/1991 | Choy .................. 714/719 |
| 5,604,756 | A | * | 2/1997 | Kawata .................. 714/773 |
| 5,646,948 | A | * | 7/1997 | Kobayashi et al. ........ 714/719 |
| 6,591,384 | B1 | * | 7/2003 | Chou .................. 714/718 |
| 6,853,597 | B2 | * | 2/2005 | Jain .................. 365/201 |
| 7,117,404 | B2 | * | 10/2006 | Ernst et al. .......... 714/718 |
| 7,240,253 | B2 | * | 7/2007 | Yoshida et al. ........ 714/718 |
| 7,366,965 | B2 | * | 4/2008 | Yamasaki et al. ........ 714/718 |
| 2003/0063517 | A1 | * | 4/2003 | Jain .................. 365/230.05 |

FOREIGN PATENT DOCUMENTS

| | | |
|---|---|---|
| JP | 06-267298 | 9/1994 |
| JP | 11-250698 | 9/1999 |
| KR | 10-1999-0069163 | 9/1999 |
| KR | 1020030002161 A | 1/2003 |
| KR | 1020030045939 A | 6/2003 |
| KR | 1020050055464 A | 6/2005 |

* cited by examiner

*Primary Examiner*—David Ton
(74) *Attorney, Agent, or Firm*—F. Chau & Assoc., LLC

(57) ABSTRACT

The present invention provides a semiconductor memory device comprising a memory cell array including a plurality of memory regions, an address decoding portion for decoding an address applied from an external portion for simultaneously selecting all of the plurality of memory regions during a test read operation, a data IO control portion for receiving test pattern data and writing the test pattern data to each of the plurality of memory regions during a test write operation, and reading the test pattern data from one of the plurality of memory regions and outputting the test pattern data during the test read operation, a data IO portion for receiving the test pattern data from the external portion and applying the test pattern data to the data IO control portion during the test write operation, and receiving the test pattern data output from the data IO control portion and conditionally outputting the test pattern data as test status data to the external portion in response to an output control signal during the test read operation, and a test control signal generating portion for comparing the test pattern data read from the plurality of memory regions to generate the output control signal for conditionally outputting the test pattern data as the test status data during the test read operation.

27 Claims, 5 Drawing Sheets

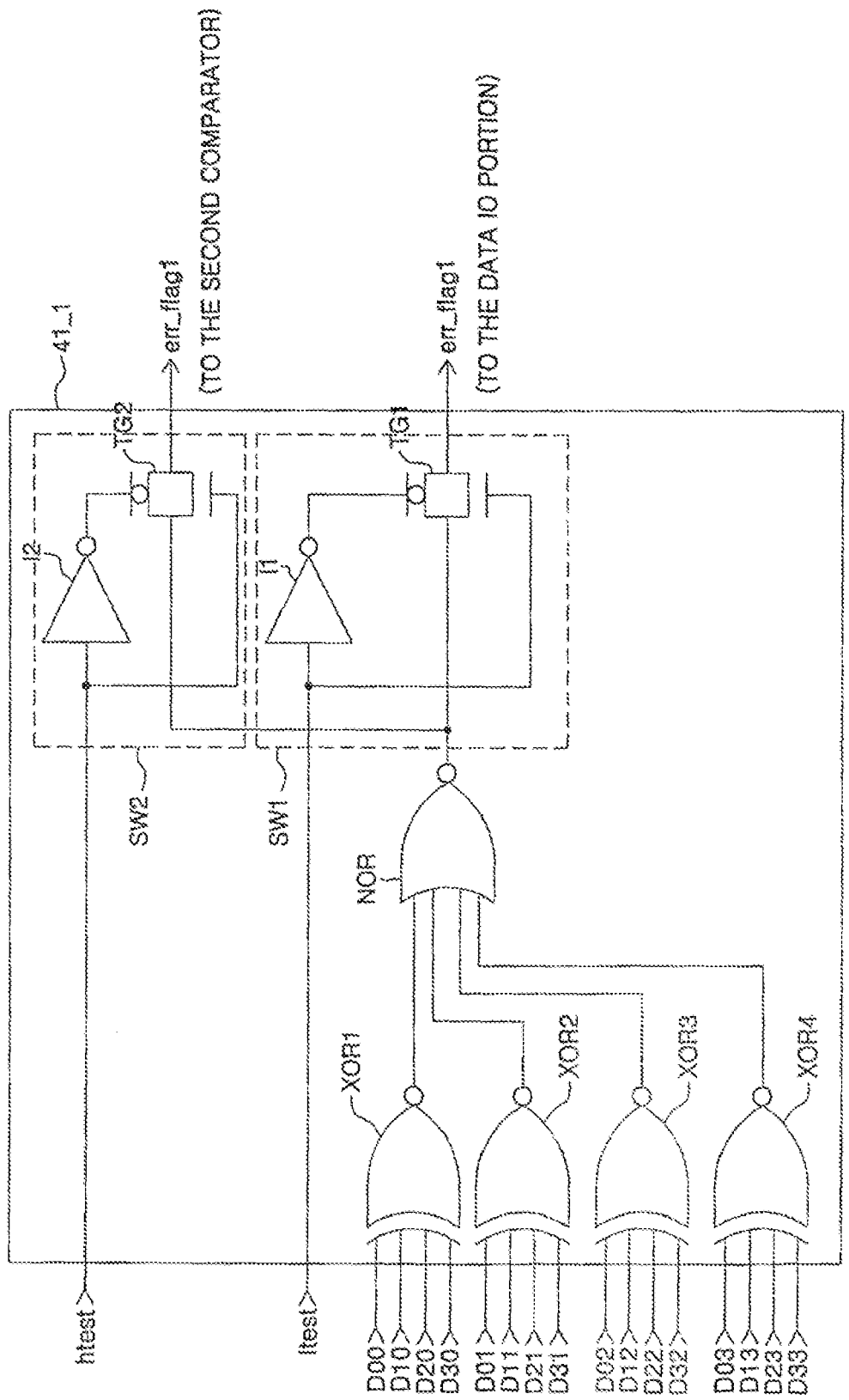

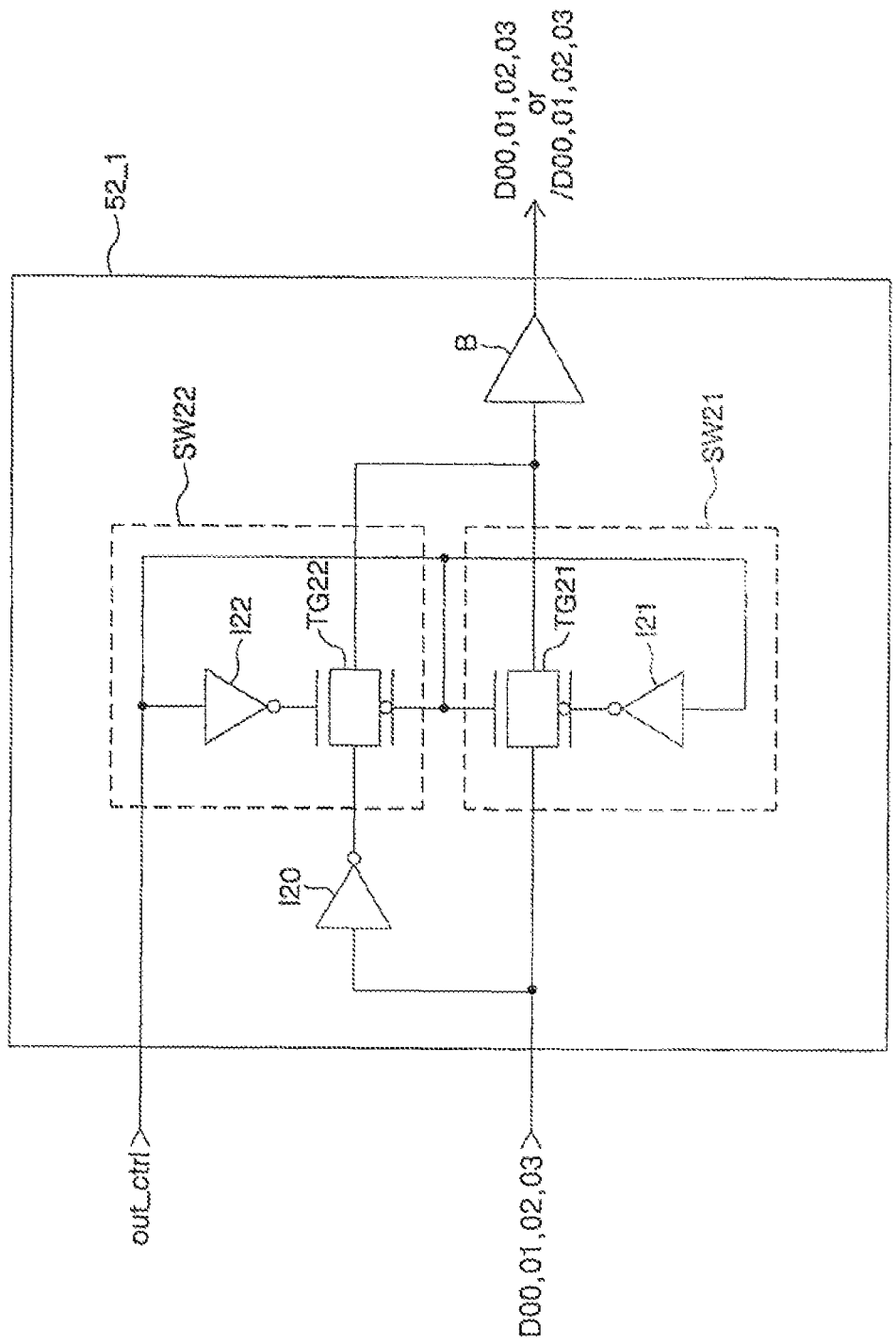

SEMICONDUCTOR MEMORY DEVICE

CROSS-REFERENCE TO RELATED APPLICATION

This application claims priority to Korean Patent Application No. 2005-129929, filed Dec. 26, 2005. the contents of which are incorporated herein by reference.

BACKGROUND OF THE INVENTION

1. Technical Field

The present invention relates to a semiconductor memory device and, more particularly, to a semiconductor memory device with reduced testing time.

2. Discussion of the Related Art

Semiconductor memory devices are tested using low frequency memory tests for identifying locations of defective memory cells and high frequency memory tests for determining whether semiconductor memory devices operate correctly.

The low frequency test divides a semiconductor memory array into memory blocks and simultaneously tests the memory blocks to determine whether memory cells are defective. For the low frequency test, a parallel bit test technique may be used where data having the same value are written into the memory cells and data output from the memory cells during a read operation are compared.

The high frequency test checks whether a selected memory cell operates correctly in an actual operation by writing test pattern data having an expected value into the selected memory cell and by checking whether the data output from the selected memory cell has the expected value. However, the number of memory cells which can be simultaneously subjected to a single high frequency test is limited, and thus the same test operation is repetitively performed to check whether all of the memory cells operate correctly.

Thus, the high frequency test time is longer and testing cost is higher than the low frequency test.

FIG. 1 is a circuit diagram of a conventional semiconductor memory device having four (4) data IO pins a 4-bit burst latency. The semiconductor memory device includes a memory cell array divided into four (4) memory blocks MB1 to MB4, a column decoder 1, a row decoder 2, a data IO controller 3, a test control signal generator 4, a data IO portion 5, and an operation controller 6. Each of the memory blocks MB1 to MB4 is divided into four (4) sub blocks SMB1 to SMB4 according to the four (4) data IO pins and a 4-bit burst latency, and each sub block SMB1 to SMB4 simultaneously writes or reads four (4) data D00 to D30, D01 to D31, D02 to D32, and D03 to D33, respectively, according to the 4-bit burst latency. Under control of the column decoder 1 and the row decoder 3, only one memory block MB1 writes or reads data during the high frequency test, and all of the memory blocks MB1 to MB4 simultaneously write or read data during the low frequency test.

The column decoder 1 decodes a column address CA to generate column select signals for selecting one memory block MB1, MB2, MB3, or MB4, when performing the read or write operation during the high frequency test, and to generate a column select signal for simultaneously selecting all of the memory blocks MB1, MB2, MB3, and MB4 during the low frequency test.

The row decoder 2 decodes a row address RA to generate a word line enable signal for selecting one memory block MB1, MB2, MB3, or MB4, when performing the read or write operation during the high frequency test and to generate a word line enable signal for simultaneously selecting all of the memory blocks MB1, MB2, MB3, and MB4 during the low frequency test.

The data IO controller 3 includes four (4) DEMUXs 3_11 to 3_14 which parallel-convert 4 serial test pattern data D00, 01,02,03 to D30,31,32,33 into 16 parallel data D00 to D30, D01 to D31, D02 to D32, and D03 to D33 and apply them to the corresponding memory blocks MB1 to MB4 and four (4) MUXs 3_21 to 3_24 which serial-convert 16 parallel data D00 to D30, D01 to D31, D02 to D32, and D03 to D33 into 4 serial test pattern data D00,01,02,03 to D30,31,32,33. During the high frequency test, only one DEMUX 3_11, 3_12, 3_13, or 3_14 or MUX 3_21, 3_22, 3_23, or 3_24 is enabled as in a non-test, normal operation. However, during the write operation of the low frequency test, all DEMUXs 3_11, 3_12, 3_13, and 3_14 are enabled to apply the parallel-converted data D00 to D30, D01 to D31, D02 to D32, and D03 to D33 to all of the memory blocks MB1, MB2, MB3 and MB4, and during the read operation of the low frequency test, all of the MUXs 3_21, 3_22, 3_23, and 3_24 are disabled to avoid outputting data to the data IO portion 5. Therefore, data conflict is averted between error detecting signals err_flag1 to err_flag4, output from the test control signal generator 4, and test pattern data D00,01,02,03 to D30,31,32,33, output from the data IO controller 3.

Here, each of the test pattern data D00,01,02,03 to D30, 31,32,33 applied during the low frequency test is 4-bit serial data having the same data value.

The test control signal generator 4 includes comparators 4_1 to 4_4 which respectively correspond to a plurality of memory blocks MB1 to MB4 and compare 16 data D00 to D30, D01 to D31, D02 to D32, and D03 to D33 output from the corresponding memory block MB1, MB2, MB3, or MB4 twice in a sub block (SMB1 to SMB4) unit and a memory block (MB1) unit to generate the error detecting signals err_flag1 to err_flag4 which indicate whether an error occurs during the read operation of the low frequency test.

The data IO portion 5 includes data input portions 5_11 to 5_14 and data output portions 5_21 to 5_24 which are respectively connected to 4 data IO pins (not shown). Each data input portion 5_11, 5_12, 5_13, and 5_14 applies the test pattern data D00,01,02,03 output from the corresponding data IO pin to the DEMUX 3_11, and each data output portion 5_21, 5_22, 5_23, and 5_24 applies the test pattern, data D00,01,02,03 or the error detecting signal err_flag1 to the corresponding data IO pin.

The operation controller 6 determines an operation state of the semiconductor memory device in response to command signals applied from an external portion and generates control signals, such as a DEMUX enable signal dme, a MUX enable signal me, a low frequency test signal ltest, and a high frequency test signal htest, to control operation of the semiconductor memory device. That is, the operation controller 6 has all of the memory blocks MB1 to MB4 write data having the same data value according to the test pattern data D00,01,02, 03 to D30,31,32,33 applied from the external portion and then to read them to generate a plurality of error detecting signals err_flag1 to err_flag4 during the low frequency test, and has one memory block MB1, MB2, MB3, or MB4 to write and read data as in a non-test normal operation to generate the test pattern data D00,01,02,03 to D30,31,32,33 during the high frequency test.

In low frequency test mode, the semiconductor memory device receives the 4 test pattern data D00,01,02,03 to D30, 31,32,33 having the same data value from the external portion and performs a burst writing operation to store 16 data D00 to D30, D01 to D31, D02 to D32, and D03 to D33 having the same data value in the sub blocks SMB1 to SMB4 in all of the memory blocks MB1 to MB4, respectively. In this state, a burst reading operation is performed to have the sub blocks SMB1 to SMB4 in all of the memory blocks MB1 to MB4 to output the 16 data D00 to D30, D01 to D31, D02 to D32, and D13 to D33, respectively.

The comparators 4_1 to 4_4 respectively compare the 16 data D00 to D30, D01 to D31, D02 to D32, and D03 to D33 output from the memory blocks MB1 to MB4 twice in a sub block (SMB1 to SMB4) unit and a memory block (MB1 to MB4) unit to generate the error detecting signals err_flag1 to err_flag4, and the data output portions 5_21 to 5_24 respectively output the error detecting signals err_flag1 to err_flag4 to the external portion.

An external test device receives and analyzes the error detecting signals err_flag1 to err_flag4. When all of the error detecting signals err_flag1 to err_flag4 have a high logic level all of the memory blocks MB1 to MB4 operate correctly, and when an individual error detecting signal has a low logic level, the memory block corresponding to the individual error detecting signal is defective.

Subsequently, a high frequency test operation of the semiconductor memory device will be explained.

In high frequency test mode, the semiconductor memory device receives the 4 test pattern data D00,01,02,03 to D30, 31,32,33 from the external portion and performs a burst writing operation to store 4 data D00 to D30, D01 to D31, D02 to D32, and D03 to D33 in the sub blocks SMB1 to SMB4, respectively, in one memory block MB1, MB2, MB3, or MB4. In this state, a burst reading operation is performed to have the sub blocks SMB1 to SMB4 in one memory block MB1 to output the 16 data D00 to D30, D01 to D31, D02 to D32, and D13 to D33, respectively. At this time, as the test pattern data used for the high frequency test, 4-bit serial data having different data values may be used differently from the low frequency test.

One MUX 3_21 serial-converts the 16 data D00 to D30, D01 to D31, D02 to D32, and D03 to 033 output from one memory block MB1 to generate the 4 test pattern data D00, 01,02,03 to D30,31,32,33, and the data IO portion 5 output the 4 test pattern data D00,01,02,03 to D30,31,32,33 to the external portion.

The external test device receives and analyzes the 4 test pattern data D00,01,02,03 to D30,31,32,33 output from the semiconductor memory device and checks whether the 4 test pattern data D00,01,02,03 to D30,31,32,33 are identical to the test pattern data D00,01,02,03 to D30,31,32,33 input to the semiconductor memory device, thereby checking whether the certain memory block MB1 and peripheral circuits for driving it operate correctly.

The high frequency test operation described above is performed again to check whether the other memory block MB2 which is not tested and its peripheral circuits operate correctly. That is, the semiconductor memory device having the 4 memory blocks MB1 to MB4 like FIG. 1 has to be subjected to the same test operation four times to complete the high frequency test.

SUMMARY OF THE INVENTION

An embodiment of the present invention includes a semiconductor memory device comprising a memory cell array having a plurality of memory regions, an address decoding portion for decoding an address applied from an external portion for simultaneously selecting all of the plurality of memory regions during a test read operation, a data IO control portion for receiving test pattern data and writing the test pattern data to each of the plurality of memory regions during a test write operation and reading the test pattern data from one of the plurality of memory regions and outputting the test pattern data during the test read operation, a data IO portion for receiving the test pattern data from the external portion and applying the test pattern data to the data IO control portion during the test write operation, and receiving the test pattern data output from the data IO control portion and conditionally outputting the test pattern data as test status data to the external portion in response to an output control signal during the test read operation, and a test control signal generating portion for comparing the test pattern data read from the plurality of memory regions to generate the output control signal for conditionally outputting the test pattern data as the test status data during the test read operation.

Each test pattern data may have the same data value. The test control signal generating portion includes a plurality of first comparators, which correspond to the plurality of memory regions, to determine whether the test pattern data read from the corresponding memory regions are identical and to generate error detecting signals for indicating an error occurrence during the test read operation, and a second comparator for generating the output control signal, which allows the test pattern data output as the test status data when all of the error detecting signals indicate no error occurrence and blocks the test pattern data output as the test status data when one or more of the error detecting signals indicate an error occurrence.

The data IO portion may include a plurality of data input portions for receiving the test pattern data from the external portion and applying the test pattern data to the data IO control portion, and a plurality of data output portions for receiving the test pattern data output from the data IO control portion and conditionally outputting the test pattern data as the test status data in response to the output control signal. Each of the data output portions may include a tri-state buffer, which conditionally outputs the test pattern data as the test status data in response to the output control signal.

The data IO portion may include a plurality of data input portions for receiving the test pattern data from the external portion and applying the test pattern data to the data IO control portion, and a plurality of data output portions for receiving the test pattern data output from the data IO control portion, and conditionally inverting and outputting the test pattern data as the test status data in response to the output control signal. Each of the data output portions may include a first switch for conditionally outputting the test pattern data as the test status data to the external portion in response to the output control signal, an inverter for inverting the test pattern data, and a second switch for conditionally outputting the inverted test pattern data as the test status data to the external portion in response to the output control signal, which conditionally blocks the test pattern data output as the test status data.

An embodiment of the present invention includes a semiconductor memory device comprising a memory cell array including a plurality of memory regions, an address decoding portion for decoding an address applied from an external portion for simultaneously selecting all of the plurality of memory regions during first and second test read operations, a data IO control portion for receiving test pattern data and writing the test pattern data to each of the plurality of memory regions during a first write operation, stopping its operation during the first read operation, and reading the test pattern data from one of the plurality of memory regions and outputting the test pattern data during the second test read operation, a data IO portion for receiving the test pattern data from the external portion and applying the test pattern data to the data IO control portion during the first and second test write operations, outputting error detecting signals as test status data to the external portion during the first test read operation, and receiving the test pattern data output from the data IO control portion and conditionally outputting the test pattern data as the test status data to the external portion in response to an output control signal during the second test read operation, and a test control signal generating portion for comparing the test pattern data read from the plurality of memory regions to generate the error detecting signals for indicating an error occurrence and comparing the error detecting signals to generate an output control signal for conditionally outputting the test pattern data as the test status data, wherein the error detecting signals are output to the data IO portion during the first test read operation and the output control signal is output to the data IO portion during the second test read operation.

Each test pattern data may have the same data value. The test control signal generating portion may include a plurality of first comparators, which correspond to the plurality of memory regions, to determine whether the test pattern data output from the corresponding memory regions are identical, to generate error detecting signals for indicating an error occurrence and to apply the error detecting signals to the data IO portion during the first test read operation, and a second comparator for receiving the error detecting signals of the first comparators, generating the output control signal, which allows the test pattern data output as the test status data when all of the error detecting signals indicate no error occurrence and blocks the test pattern data output as the test status data when one or more of the error detecting signals indicate an error occurrence, and applying the output control signal to the data IO portion during the second test read operation.

The data IO portion may include a plurality of data input portions for receiving the test pattern data from the external portion and applying the test pattern data to the data IO control portion, and a plurality of data output portions for receiving the error detecting signals from the test control signal generating portion and conditionally outputting the test pattern data as the test status data to the external portion during the first read operation, receiving the test pattern data from the data IO control portion during the second test read operation, and conditionally outputting the test pattern data as the test status data to the external portion in response to the output control signal. Each of the data output portions may include a tri-state buffer which conditionally outputs the test pattern data as the test status data in response to the output control signal.

The data IO portion may include a plurality of data input portions for receiving the test pattern data from the external portion and applying the test pattern data to the data IO control portion, and a plurality of data output portions for receiving the error detecting signals from the test control signal generating portion and outputting the error detecting signals during the first read operation, and receiving the test pattern data from the data IO control portion and conditionally inverting and outputting the test pattern data as the test status data in response to the output control signal during the second test read operation. Each of the data output portions may include a first switch for conditionally outputting tire test pattern data as the test status data to the external portion in response to the output control signal, an inverter for inverting the test pattern data, and a second switch for conditionally outputting the inverted test pattern data as the test status data to the external portion in response to the output control signal, which conditionally blocks the test pattern data output as the test status data.

BRIEF DESCRIPTION OF THE DRAWINGS

Exemplary embodiments of the present invention can be understood in more detail from the following descriptions taken in conjunction with the attached drawings in which:

FIGS. 3A and 3B are circuit diagrams illustrating the test control signal generator of the semiconductor memory device of FIG. 2;

FIG. 5 is a circuit diagram illustrating a data output portion of the semiconductor memory device of FIG. 2 according to an embodiment of the present invention.

DETAILED DESCRIPTION OF EXEMPLARY EMBODIMENTS

Exemplary embodiments of the present invention will now be described more fully with reference to the accompanying drawings. The present invention may, however, be embodied in different forms and should not be construed as limited to the embodiments set forth herein. Like numbers refer to like elements throughout the specification.

Figure 2:
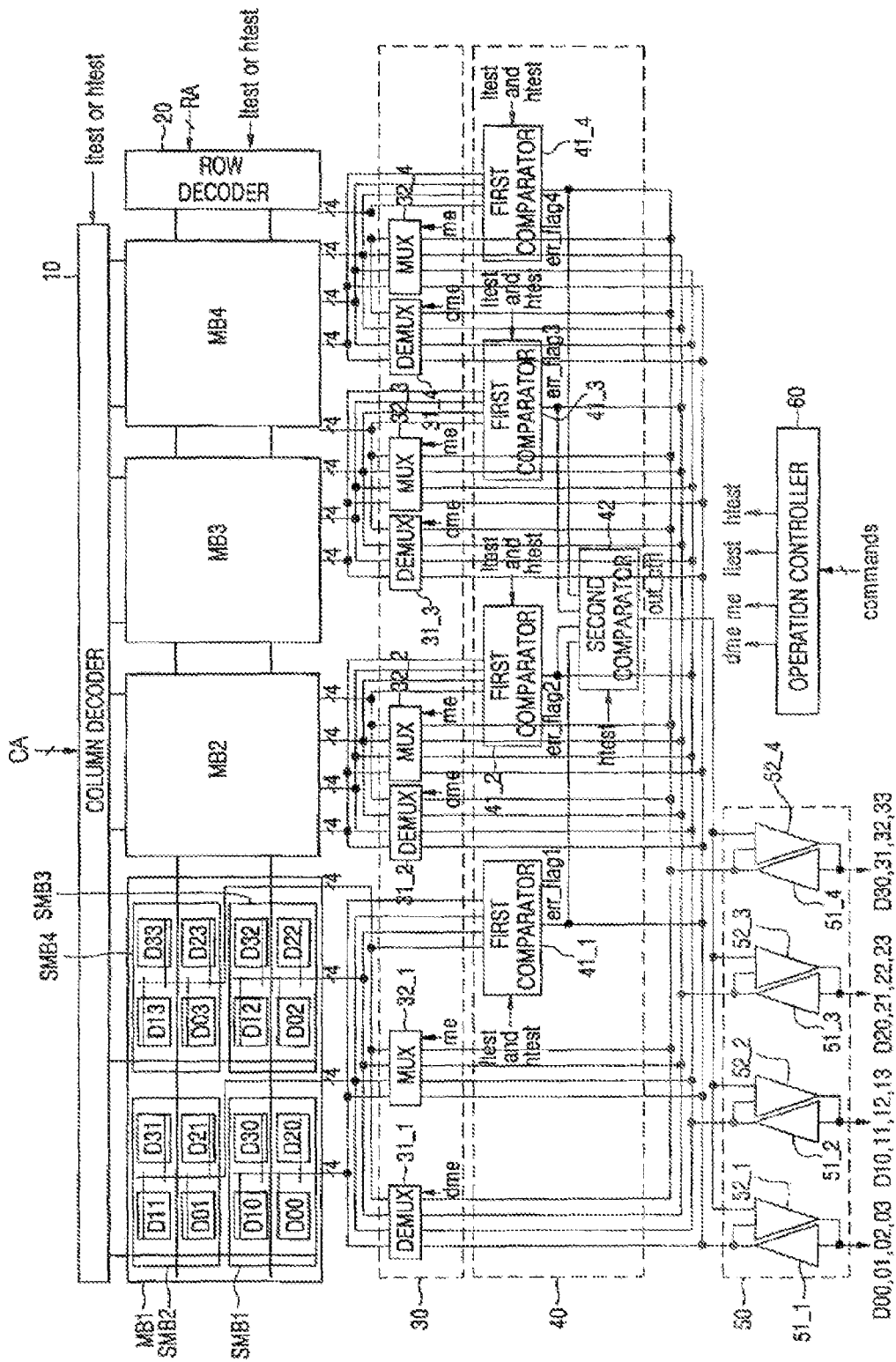
FIG. 2 is a circuit diagram of a semiconductor memory device according to an embodiment of the present invention.

FIG. 2 is a circuit diagram of a semiconductor memory device according to an embodiment of the present invention. FIG. 2 also shows a semiconductor memory device having four (4) data IO pins a 4-bit burst latency. A configuration and operation of the semiconductor memory device related to the low and high frequency tests will be explained below.

Figure 1:
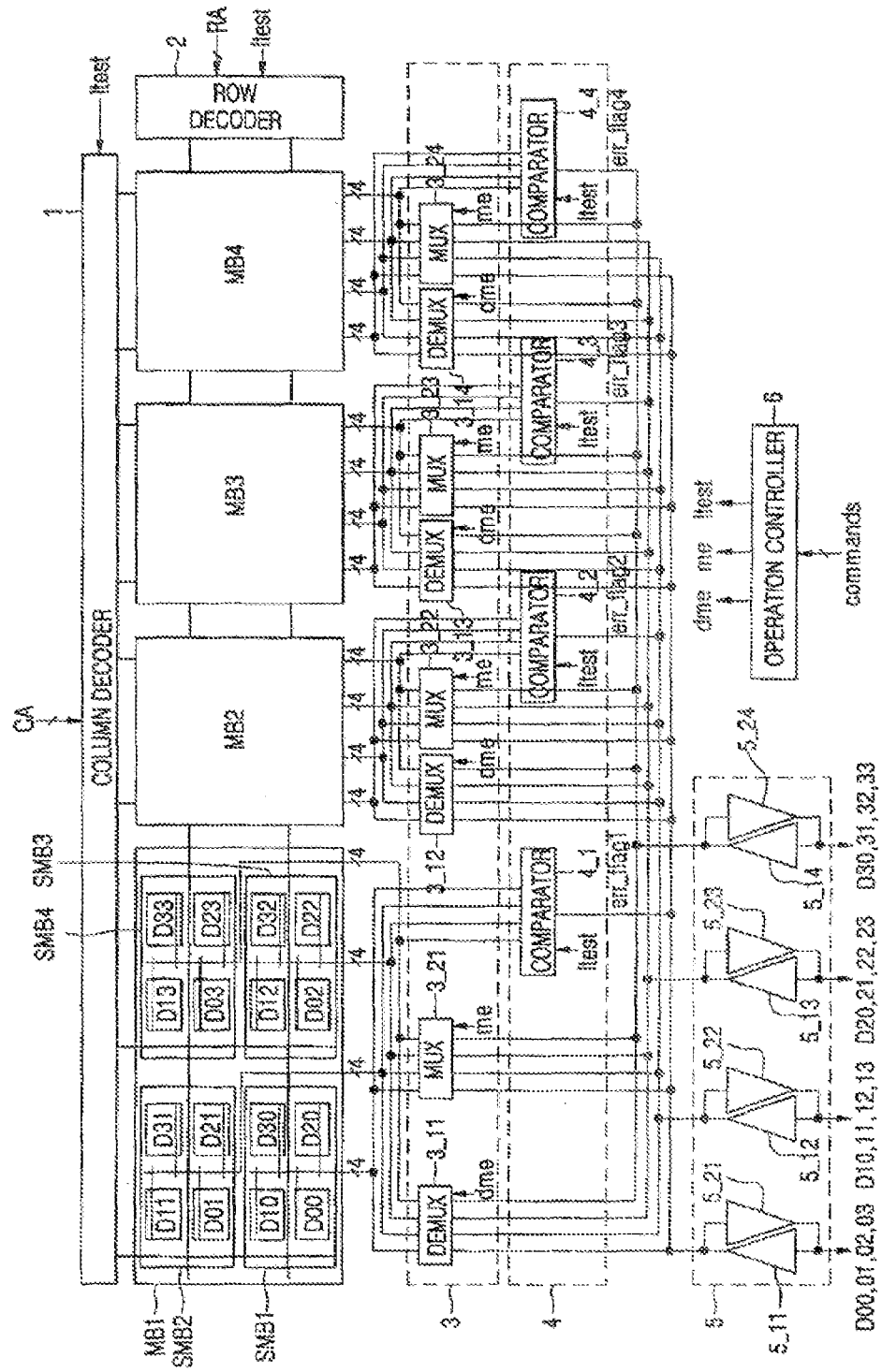
FIG. 1 is a circuit diagram of a conventional semiconductor memory device.

Referring to FIG. 2, the semiconductor memory device includes a memory cell array divided into memory cell blocks MB1 to MB4, a column decoder 10, a row decoder 20, a data IO controller 30, a test control signal generator 40, a data IO portion 50, and an operation controller 60. The semiconductor memory device of FIG. 2 performs a similar low frequency test operation as the semiconductor memory device of FIG. 1 but a different high frequency test operation from the semiconductor memory device of FIG. 1.

The memory cell array is divided into four (4) memory blocks MB1 to MB4, each of the memory blocks MB1 to MB4 is divided into four (4) sub blocks SMB1 to SMB4 according to the four (4) data IO pins and a 4-bit burst latency, and each sub block SMB1, SMB2, SMB3, and SMB4 simultaneously writes or reads four (4) data D00 to D30, D01 to D31, D02 to D32, and D03 to D33, respectively, according to the 4-bit burst latency. The sub blocks SMB1 to SMB4 in all of the memory blocks MB1 to MB4 simultaneously write or read data during the high frequency test as well as the low frequency test.

The column decoder 10 decodes a column address CA to generate a column select signal for selecting all of the memory blocks MB1 to MB4 during the high frequency test and the low frequency test. The row decoder 2 decodes a row address RA to generate a word line enable signal for selecting all of the memory blocks MB1 to MB4 during the high frequency test and the low frequency test.

For example, when there are four (4) memory blocks and the column decoder 10 selects the memory blocks using 2 most significant bits (MSB) of the column address CA, the column decoder 10 sets the 2 most significant bits to a "don't care" state to simultaneously select all of the memory blocks MB1 to MB4.

The data IO controller 30 includes four (4) DEMUXs 31_1 to 31_4 which parallel-convert 4 test pattern data D00,01,02, 03 to D30,31,32,33 into 16 parallel data D00 to D30, D01 to D31, D02 to D32, and D03 to D33 and apply them to the corresponding memory blocks MB1 to MB4 and four (4) MUXs 32_1 to 32_4 which serial-convert 16 parallel data D00 to D30, D01 to D31, D02 to D32, and D03 to D33 into 4 test pattern data D00,01,02,03 to D30,31,32,33. During the write operation of the high frequency test as well as the low frequency test, all DEMUXs 31_1 to 31_4 are enabled to apply the parallel-converted data D00 to D30, D01 to D31, D02 to D32, and D03 to D33 to all of the memory blocks MB1 to MB4. During the read operation of the high frequency test, only one MUX 32_1 is enabled to generate the test pattern data D00,01,02,03 to D30,31,32,33 corresponding to one memory block MB1, MB2, MB3, or MB4 and to apply them to the data IO portion 50, and during the read operation of the low frequency test, all of the MUXs 32_1 to 32_4 are disabled not to output any data to the data IO portion 5.

Here, each of the test pattern data D00,01,02,03 to D30, 31,32,33 applied during the high frequency test is 4-bit serial data having the same data value, similar to the low frequency test.

The test control signal generator 40 includes first comparators 41_1 to 41_4 which respectively correspond to a plurality of memory blocks MB1 to MB4 and compares 16 data D00 to D30, D01 to D31, D02 to D32, and D03 to 033 output from the sub blocks SMB1 to SMB4 in the corresponding memory blocks MB1 to MB4 to generate the error detecting signals err_flag1 to err_flag4 which are to indicate whether an error occurs, and a second comparator 42 which generates an output control signal out_ctrl for controlling an output of data according to the error detecting result. During the read operation of the high frequency test, an output control signal out_ctrl for controlling an output of data is generated through the first comparators 41_1 to 41_4 and the second comparator 42, and during the read operation of the low frequency test, the error detecting signals err_flag1 to err_flag4 which are to notify whether errors occur the memory blocks MB1 to MB4 and an output control signal out_ctrl for controlling an output of data are generated through the first comparators 4_11 to 41_4 and the second comparator 42. The test control signal generator 40 controls whether to output the test pattern data D00,01,02,03 to D30,31,32,33 according to whether the memory blocks MB1 to MB4 operate correctly during the high frequency test, but the error detecting signals err_flag1 to err_flag4 generated by the test control signal generator 40 is unconditionally applied to the external portion during the low frequency test.

The data IO portion 5 includes data input portions 51_1 to 51_4 and data output portions 52_1 to 52_4 which are respectively connected to 4 data IO pins (not shown). Each data input portion 51_1 to 51_4 applies the test pattern data D00, 01,02,03 to D30,31,32,33, respectively, output from the data IO pin to the DEMUX 31_1 to 31_4, and each data output portion 52_1 to 52_3 determines whether to output the test pattern data D00,01,02,03 to D31,31,32,33 applied from the data IO controller 30 in response to the output control signal out_ctrl. That is, the data output portions 52_1 to 52_4 determine whether to output the test pattern data D00,01,02,03 to D30,31,32,33 applied from the data IO controller 30 in response to the output control signal out_ctrl during the read operation of the high frequency test, and unconditionally outputs the error detecting signals err_flag1 to err_flag4 applied from the first comparators 41_1 to 41_4 to the external portion in response to the output control signal out_ctrl during the read operation of the low frequency test.

The operation controller 60 determines an operation state of the semiconductor memory device in response to command signals applied from an external portion and generates control signals, such as a DEMUX enable signals dme, a MUX enable signal me, a high frequency test signal htest, and a low frequency test signal ltest, to control an operation of the semiconductor memory device. For example, during the high frequency test and the low frequency test, the operation controller 60 has all of the memory blocks MB1 to MB4 to write data D00 to D30, D01 to D31, D02 to D32, and D03 to D33 having the same data value according to the test pattern data D00,01,02,03 to D30,31,32,33 applied from the external portion and then to read them, but generates the test pattern data D00,01,02,03 to D30,31,32,33 corresponding to one memory block MB1, MB2, MB3, or MB4 and allows the test pattern data D00,01,02,03 to D30,31,32,33 to be output to the external portion under control of the output control signal out_ctrl only when all of the memory blocks MB1 to MB4 correctly operate In high frequency test mode, the semiconductor memory device receives the 4 test pattern data D00,01,02,03 to D30, 31,32,33 having the same data value from the external portion and performs a burst writing operation to store 16 data D00 to D30, D01 to D31, D02 to D32, and D03 to D33 having the same data value in the sub blocks SMB1 to SMB4 in all of the memory blocks MB1 to MB4, respectively. In this state, a burst reading operation is performed to have the sub blocks SMB1 to SMB4 in all of the memory blocks MB1 to MB4 to output the 16 data D00 to D30, D01 to D31, D02 to D32, and D13 to D33, respectively.

The first comparators 41_1 to 41_4 respectively compare the 16 data D00 to D30, D01 to D31, D02 to D32, and D03 to D33 applied from the corresponding memory blocks MB1 to MB4 twice in a sub block (SMB1 to SMB4) unit and a memory block (MB1 to MB4) unit to generate the error detecting signals err_flag1 to err_flag4 which are to indicate whether an error occurs, respectively. When all of the 16 data D00 to D30, D01 to D31, D02 to D32, and D03 to D33 applied from the corresponding memory block MB1 have the same data value, the first comparator 41_1 generates the error detecting signal err_flag1 which is to indicate that the corresponding memory block MB1 correctly operates, and when one or more data D00 is different, it generates the error detecting signal err_flag1 which is to indicate an abnormal operation. The second comparator 42 receives the error detecting signals err_flag1 to err_flag4 applied from the first comparators 41_to 41_4, and generates the output control signal out_ctrl which allows an output of the data output portions 52_1 to 52_4 when all of the error detecting signals err_flag1 to err_flag4 notify that all of the corresponding memory blocks MB1 to MB4 correctly operate and generates the output control signal out_ctrl which blocks an output of the data output portions 52_1 to 52_4 when one or more error detecting signal notifies that the corresponding memory block MB1 abnormally operates.

Meanwhile, the data IO controller 30 converts the 16 data D00 to D30, D01 to D31, D02 to D32, and D03 to D33 applied from one memory block MB1 into the 4 test pattern data D00,01,02,03 to D30,31,32,33 through one MUX 32_1 under control of the operation controller 60 and outputs them.

The data output portions 52_1 to 52_4 output the 4 test pattern data D00,01,02,03 to D30,31,32,33 applied from the MUX 32_1 of the data IO controller 30 to the external portion when the output control signal out_ctrl which allows the output of the data output portions 52_1 to 52_4 is received and stops the output operation of the data output portions 52_1 to 52_4 when the output control signal out_ctrl which blocks the output of the data output portions 52_1 to 52_4 is received.

As described above, the 4 test pattern data D00,01,02,03 to D30,31,32,33 are provided to the external test device only when all of the memory blocks correctly operate.

Figure 3B:
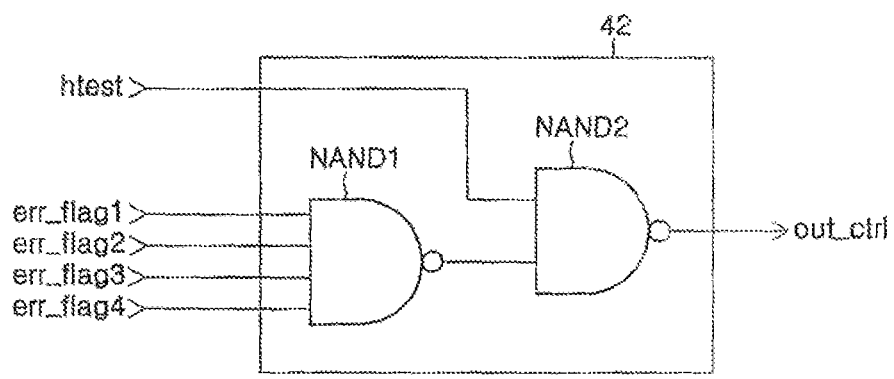

FIGS. 3A and 3B are circuit diagrams illustrating the test control signal generator of the semiconductor memory device of FIG. 2. FIG. 3A shows the first comparator, and FIG. 3B shows the second comparator.

Referring to FIG. 3A, the first comparator 41_1 includes 4 XOR gates XOR1 to XOR4 which respectively correspond to the sub blocks SMB1 to SMB4 and XOR the 4 data D00 to D30, D01 to D31, D02 to D32, and D03 to D33 applied from the corresponding sub blocks SMB1 to SMB4, a NOR gate NOR which NORs output signals of the XOR gates XOR1 to XOR4 to generate the error detecting signal err_flag1, a first switch SW1 which applies the error detecting signal err_flag1 to the data output portion 51_1 when the low frequency test signal ltest is enabled, and a second switch SW2 which applies the error detecting signal err_flag1 to the second comparator 42 when the high frequency test signal htest is enabled. Here, the tests SW1 and SW2 comprise inverters I1 and I2 and transmission gates TG1 and TG2.

Referring to FIG. 3B, the second comparator 42 includes a first NAND gate NAND1 NANDing the error detecting signals err_flag1 to err_flag4 of the first comparators 41_1 to 4l_4, and a second NAND gate NAND2 for NANDing the high frequency test signal htest and an output signal of the first NAND gate NAND1 to generate the output control signal out_ctrl.

An operation of the test control signal generator 40 will be explained below with reference to FIGS. 3A and 3B.

For the high frequency test, the high frequency test signal htest is enabled to have a high logic level, the output control signal out_ctrl which allows the output of the data output portion 50 has a high logic level, and the output control signal out_ctrl which blocks the output of the data output portion 50 has a low logic level. At this time, the low frequency test signal has a low logic level.

First, a case where all of the sub blocks SMB1 to SMB4 correctly operate to output 4 data having the same data value, respectively during the high frequency test will be described.

The XOR gates XOR1 to XOR4 of the first comparators 41_1 to 41_4 XOR the 4 data D00 to D30, D01 to D31, D02 to D32, and D03 to D33 having the same data value applied from the corresponding sub blocks SMB1 to SMB4 to generate signals having a low logic level, and the NOR gate NOR NORs the signals having a low logic level of the XOR gates XOR1 to X0R4 to generate the error detecting signal err_flag1 having a high logic level.

The first switch SW1 is turned off in response to the low frequency test signal ltest having a low logic level, and the second switch SW2 is turned on in response to the high frequency test signal having a high logic level, so that the error detecting signal err_flag1 is applied to the second comparator 42.

Even though not shown, the remaining first comparators 41_2 to 4_4 operate in the same way as the first comparator 41_1 to generate the error flag2 to error_flag4 and to apply them to the second comparator 42.

The second comparator 42 receives the error detecting signals err_flag1 to err_flag4 having a high logic level from the first comparators 41_1 to 41_4, the first NAND gate NAND1 NANDs the error detecting signals err_flag1 to errLflag4 to generate a signal having a low logic level, and the second NAND gate NAND2 NANDs the signal having a low logic level of the first NAND gate NAND1 and the high frequency test signal having a high logic level to generate the output control signal out_ctrl having a high logic level.

As described above, when all of the sub blocks SMB1 to SMB4 correctly operate, the test control signal generator 40 generates the output control signal out_ctrl having a high logic level, thereby allowing the output of the data output portion 50.

On the other hand, when one sub block SMB1 in the first memory block MB1 abnormally operates so that one data D00 among the 4 data D00 to D30 has a different data value, the XOR gate XOR1 which receives it generate a signal having a high logic level.

The NOR gate NOR generates the error detecting signal err_flag1 having a low logic level, and the second switch SW2 applies it to the second comparator 42.

The first NAND gate NAND1 of the second comparator 42 generates a signal having a high logic level in response to one signal having a low logic level, and the second NAND gate NAND2 NANDs the signal having a high logic level of the first NAND gate NAND1 and the high frequency test signal having a high logic level to generate the output control signal out_ctrl having a low logic level.

That is, when one of the sub blocks SMB1 to SMB4 abnormally operates, the test control signal generator 40 generates the output control signal out_ctrl having a low logic level to stop the data output operation of the data output portions 52_1 to 52_4.

Also, during the low frequency test, the test control signal generator 40 has the second NAND MAND2 of the second comparator 42 to unconditionally output the output control signal out_ctrl having a high logic level regardless of the error detecting signal of the first comparators 41_1 to 41_4. This is for the data IO portion 50 to output the error detecting signals to the external portion during the low frequency test.

Thus, the test control signal generator 40 of FIG. 3 controls the output of the test pattern data during the high frequency test.

Figure 4:
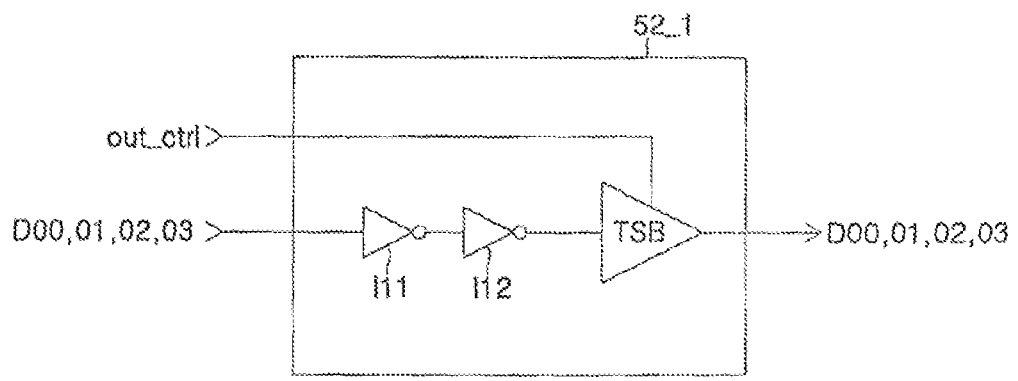
FIG. 4 is a circuit diagram illustrating a data output portion of the semiconductor memory device of FIG. 2 according to an embodiment of the present invention.

FIG. 4 is a circuit diagram illustrating a data output portion of the semiconductor memory device of FIG. 2 according to an embodiment of the present invention.

The data output portion 52_1 of FIG. 4 includes even number inverters I11 and I12 which buffer the test pattern data D00,01,02,03 and a tri-state buffer TSB which operates in response to the output control signal out_ctrl.

Like FIG. 3B, the output control signal out_ctrl of FIG. 4 has a high logic level when the output of the data output portion 50 is allowed and has a low logic level when the output of the data output portion 50 is blocked.

The tri-state buffer TSB is turned on to output the test pattern data D00,01,02,03 applied through the even number inverters I11 and I12 to the data IO pins when the output control signal out_ctrl has a high logic level and is turned off not to output the test pattern data D00,01,02,03 to the data IO pins when, the output control signal out_ctrl has a low logic level. That is, the tri-state buffer TSB makes the data IO pins become a Hi-z state.

Even though not shown, the remaining data output portions 52_2 to 52_4 operate in the same way as the data output portion 52_1 to control the output of the test pattern data D00,01,02,03 to D30,31,32,33.

That is, the semiconductor memory device which correctly operates outputs the test pattern data to the data IO pins, but the semiconductor memory device which abnormally operates makes the data IO pins become the Hi-z state.

Thus, when the semiconductor memory device abnormally operates, the external test device receives the Hi-z signals from the semiconductor memory device and recognizes that the semiconductor memory device abnormally operates through them.

FIG. 5 is a circuit diagram illustrating a data output portion of the semiconductor memory device of FIG. 2 according to an embodiment of the present invention. The data output portion 52_1 of FIG. 5 includes a first switch SW21 which is turned on in response to the output control signal out_ctrl which allows the data output to apply the test pattern data D00,01,02,03, a first inverter I20 for inverting the test pattern data D00,01,02,03, a second switch SW22 which is turned on in response to the output control signal out_ctrl which blocks the data output to apply the inverted test pattern data /D00, 01,02,03, and a butter B which buffers the test pattern data D00,01,02,03 or /D00,01,02,03 applied from the first switch SW21 or the second switch SW22. The first switch SW21 includes an inverter I21 and a transmission gate TG21, and the second switch SW22 includes an inverter I22 and a transmission gate TG22.

Like FIG. 3B, the output control signal out_ctrl of FIG. 5 has a high logic level when the output of the data output portion 50 is allowed and has a low logic level when the output of the data output portion 50 is blocked.

When the output control signal out_ctrl has a high logic level the first switch SW21 is turned on and the second switch SW22 is turned off, so that the first switch SW21 applies the test pattern data D00,01,02,03, and the buffer B buffers the test pattern data D00,01,02,03 and then applies them to the data IO pins.

On the other hand, when the output control signal out_ctrl has a low logic level, the first switch SW21 is turned off and the second switch SW22 is turned on, so that the second switch SW22 applies the inverted test pattern data /D00,01, 02,03 through the first inverter I20, and the buffer B buffers the inverted test pattern data /D00,01,02,03 and then applies them to the data IO pins.

Even though not shown, the remaining data output portions 52_2 to 52_4 operate in the same way as the data output portion 52_1 to control the output of the test pattern data D00,01,02,03 to D30,31,32,33.

That is, the semiconductor memory device which correctly operates outputs the generated test pattern data "as is", but the semiconductor memory device which abnormally operates inverts the generated test pattern data before outputting them.

Thus, when the semiconductor memory device abnormally operates, the external test device receives the Hi-z signals from the semiconductor memory device and recognizes that the semiconductor memory device abnormally operates through them.

As described above, the semiconductor memory device of the present invention operates a certain memory block in the same way as the conventional art to generate a plurality of test pattern data during the high frequency test, but it further generates the output control signal for controlling the output of the test pattern data depending on whether all of the memory blocks operate correctly, thereby making a plurality of test pattern data output to the external test device only when all of the memory blocks correctly operate.

The external test device can be ware of whether the remaining memory blocks which doe not output the test pattern data as well as the certain memory block operate correctly through a plurality of test pattern data.

In the above described embodiments, the second comparator of the test control signal generator receives the error detecting signals of the first comparators to generate the output control signal, but the test control signal generator can be configured such that the second comparator receives the error detecting signals of the first comparators except the first comparator corresponding to the memory block which operates to generate the test pattern data to thereby generate the output control signal.

As described herein before, the semiconductor memory device of the present invention operates a certain memory block in the same way as the conventional art to generate a plurality of test pattern data during the high frequency test, but it further generates the output control signal for controlling the output of the test pattern data depending on whether all of the memory blocks operate correctly, thereby making a plurality of test pattern data output to the external test device only when all of the memory blocks correctly operate. The external test device can be ware of whether the remaining memory blocks which doe not output the test pattern data as well as the certain memory block operate correctly through a plurality of test pattern data.

Accordingly, the semiconductor memory device of the present invention can complete the high frequency test by a single test operation, thereby significantly reducing a time and a cost for the high frequency test.

What is claimed is:

1. A semiconductor memory device, comprising:
a memory cell array including a plurality of memory regions;
an address decoding portion for decoding an address applied from an external portion for simultaneously selecting the plurality of memory regions during a test read operation;
a data IO control portion for receiving test pattern data and writing the test pattern data to each of the plurality of memory regions during a test write operation, and reading the test pattern data from one of the plurality of memory regions and outputting the test pattern data during the test read operation;
a data IO portion for receiving the test pattern data from the external portion and applying the test pattern data to the data IO control portion during the test write operation, and receiving the test pattern data output from the data IO control portion and conditionally outputting the test pattern data as test status data to the external portion in response to an output control signal during the test read operation; and
a test control signal generating portion for comparing the test pattern data read from the plurality of memory regions to generate the output control signal for conditionally outputting the test pattern data as the test status data during the test read operation.

2. The device of claim 1, wherein each test pattern data has the same data value.

3. The device of claim 1, wherein the test control signal generating portion comprises:
a plurality of first comparators, which correspond to the plurality of memory regions, to determine whether the test pattern data read from the corresponding memory regions are identical and to generate error detecting signals for indicating an error occurrence during the test read operation; and
a second comparator for generating the output control signal, which allows the test pattern data output as the test status data when all of the error detecting signals indicate no error occurrence and blocks the test pattern data output as the test status data when one or more of the error detecting signals indicate an error occurrence.

4. The device of claim 1, wherein the data IO portion comprises:
  a plurality of data input portions for receiving the test pattern data from the external portion and applying the test pattern data to the data IO control portion; and
  a plurality of data output portions for receiving the test pattern data output from the data IO control portion and conditionally outputting the test pattern data as the test status data in response to the output control signal.

5. The device of claim 4, wherein each of the data output portions includes a tri-state buffer, which conditionally outputs the test pattern data as the test status data in response to the output control signal.

6. The device of claim 1, wherein the data IO portion comprises:
  a plurality of data input portions for receiving the test pattern data from the external portion and applying the test pattern data to the data IO control portion; and
  a plurality of data output portions for receiving the test pattern data output from the data IO control portion, and for conditionally inverting and outputting the test pattern data as the test status data in response to the output control signal.

7. The device of claim 6, wherein each of the data output portions comprises:
  a first switch for conditionally outputting the test pattern data as the test status data to the external portion in response to the output control signal;
  an inverter for inverting the test pattern data; and
  a second switch for conditionally outputting the inverted test pattern data as the test status data to the external portion in response to the output control signal, which conditionally blocks the test pattern data output as the test status data.

8. The device of claim 1, wherein the data IO control portion comprises:
  a data input control portion for receiving the test pattern data from the data IO portion and writing the test pattern data into each of the plurality of memory regions during the test write operation; and
  a data output control portion for reading the test pattern data from one of the plurality of memory regions and outputting the test pattern data to the data IO portion during the test read operation.

9. The device of claim 8, wherein the data input control portion further comprises a function for simultaneously writing the test pattern data into the plurality of memory regions during the test write operation.

10. The device of claim 1, wherein each of the memory regions comprises a plurality of sub regions.

11. The device of claim 10, wherein the data IO control portion comprises:
  a data input control portion for receiving the test pattern data from the data IO portion, converting the test pattern data into a plurality of parallel data, and writing the plurality of parallel data into each of the plurality of sub regions during the test write operation; and
  a data output control portion for reading the plurality of parallel data from one of the plurality of sub regions, converting the plurality of parallel data into the test pattern data, and outputting the test pattern data to the data IO portion during the test read operation.

12. The device of claim 1, wherein the address decoding portion further comprises a function for decoding the address applied from the external portion for simultaneously selecting all of the plurality of memory regions during the test write operation.

13. The device of claim 1, further comprising an operation control portion for determining an operation state of the semiconductor memory device in response to external control signals.

14. A semiconductor memory device, comprising:
  a memory cell array including a plurality of memory regions;
  an address decoding portion for decoding an address applied from an external portion for simultaneously selecting the plurality of memory regions during first and second test read operations;
  a data IO control portion for receiving test pattern data and writing the test pattern data to each of the plurality of memory regions during a first write operation, stopping its operation during the first read operation, and reading the test pattern data from one of the plurality of memory regions and outputting the test pattern data during the second test read operation;
  a data IO portion for receiving the test pattern data from the external portion and applying the test pattern data to the data IO control portion during the first and second test write operations, outputting error detecting signals as test status data to the external portion during the first test read operation, and receiving the test pattern data output from the data IO control portion and conditionally outputting the test pattern data as the test status data to the external portion in response to an output control signal during the second test read operation; and
  a test control signal generating portion for comparing the test pattern data read from the plurality of memory regions to generate the error detecting signals for indicating an error occurrence and comparing the error detecting signals to generate an output control signal for conditionally outputting the test pattern data as the test status data, wherein the error detecting signals are output to the data IO portion during the first test read operation and the output control signal is output to the data IO portion during the second test read operation.

15. The device of claim 14, wherein each test pattern data has the same data value.

16. The device of claim 14, wherein the test control signal generating portion comprises:
  a plurality of first comparators, which correspond to the plurality of memory regions, to determine whether the test pattern data output from the corresponding memory regions are identical, to generate error detecting signals for indicating an error occurrence, and to apply the error detecting signals to the data IO portion during the first test read operation; and
  a second comparator for receiving the error detecting signals of the first comparators, generating the output control signal, which allows the test pattern data output as the test status data when all of the error detecting signals indicate no error occurrence and blocks the test pattern data output as the test status data when one or more of the error detecting signals indicate an error occurrence, and applying the output control signal to the data IO portion during the second test read operation.

17. The device of claim 16, wherein the second comparator further comprises a function for generating the output control signal, which conditionally allows the test pattern data output as the test status data during the first test operation, and applying the output control signal to the data IO portion.

18. The device of claim 14, wherein the data IO portion comprises:

a plurality of data input portions for receiving the test pattern data from the external portion and applying the test pattern data to the data IO control portion; and a plurality of data output portions for receiving the error detecting signals from the test control signal generating portion and conditionally outputting the test pattern data as the test status data to the external portion during the first read operation, receiving the test pattern data from the data IO control portion during the second test read operation, and conditionally outputting the test pattern data as the test status data to the external portion in response to the output control signal.

19. The device of claim 18, wherein each of the data output portions includes a tri-state buffer which conditionally outputs the test pattern data as the test status data in response to the output control signal.

20. The device of claim 14, wherein the data IO portion comprises;

a plurality of data input portions for receiving the test pattern data from the external portion and applying the test pattern data to the data IO control portion; and a plurality of data output portions for receiving the error detecting signals from the test control signal generating portion and outputting the error detecting signals during the first test read operation, and receiving the test pattern data from the data IO control portion and conditionally inverting and outputting the test pattern data as the test status data in response to the output control signal during the second test read operation.

21. The device of claim 20, wherein each of the data output portions comprises:

a first switch for conditionally outputting the test pattern data as the test status data to the external portion in response to the output control signal;

an inverter for inverting the test pattern data; and a second switch for conditionally outputting the inverted test pattern data as the test status data to the external portion in response to the output control signal, which conditionally blocks the test pattern data output as the test status data.

22. The device of claim 14, wherein the data IO control portion comprises:

a data input control portion for receiving the test pattern data from the data IO portion and writing the test pattern data into each of the plurality of memory regions during the first and second test write operations; and a data output control portion for stopping its operation during the first test read operation, and reading the test pattern data from one of the plurality of memory regions and applying the test pattern data to the data IO portion during the second test read operation.

23. The device of claim 22, wherein the data input control portion further comprises a function for simultaneously writing the test pattern data into the plurality of memory regions during the second test write operation.

24. The device of claim 14, wherein each of the memory regions comprises a plurality of sub regions.

25. The device of claim 24, wherein the data IO control portion comprises:

a data input control portion for receiving the test pattern data from the data IO portion, converting the test pattern data into a plurality of parallel data, and writing the plurality of parallel data into each of the plurality of sub regions during the first and second test write operations; and a data output control portion for stopping its operation during the first test read operation, and reading the parallel data from one of the plurality of sub regions, converting the plurality of parallel data into the test pattern data, and applying the test pattern data to the data IO portion during the second test read operation.

26. The device of claim 14, wherein the address decoding portion further comprises a function for decoding the address applied from the external portion to generate signals for simultaneously selecting all of the plurality of memory regions during the second test write operation.

27. The device of claim 14, further comprising an operation control portion for determining an operation state of the semiconductor memory device in response to external control signals.

* * * * *